(12) United States Patent
Kazi

(10) Patent No.: US 10,084,857 B2
(45) Date of Patent: Sep. 25, 2018

(54) DISPERSING DATA TO BIOLOGICAL MEMORY SYSTEMS

(71) Applicant: International Business Machines Corporation, Armonk, NY (US)

(72) Inventor: Asimuddin Kazi, Naperville, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/401,278

(22) Filed: Jan. 9, 2017

(65) Prior Publication Data

US 2017/0212806 A1     Jul. 27, 2017

Related U.S. Application Data

(60) Provisional application No. 62/287,145, filed on Jan. 26, 2016.

(51) Int. Cl.
  *G06F 11/10*  (2006.01)
  *G06N 3/00*  (2006.01)
  (Continued)

(52) U.S. Cl.
  CPC .......... *H04L 67/1095* (2013.01); *G06F 3/064* (2013.01); *G06F 3/0604* (2013.01); *G06F 3/067* (2013.01); *G06F 3/0611* (2013.01); *G06F 3/0619* (2013.01); *G06F 3/0632* (2013.01); *G06F 3/0647* (2013.01); *G06F 3/0659* (2013.01); *G06F 9/5083* (2013.01); *G06F 11/1076* (2013.01); *G06F 11/1092* (2013.01); *G06F 12/0813* (2013.01);
  (Continued)

(58) Field of Classification Search
  None
  See application file for complete search history.

(56) References Cited

U.S. PATENT DOCUMENTS 4,092,732 A    5/1978  Duchi
5,454,101 A    9/1995  Mackay et al.
         (Continued)

OTHER PUBLICATIONS

Shamir; How to Share a Secret; Communications of the ACM; vol. 22, No. 11; Nov. 1979; pp. 612-613.
(Continued)

*Primary Examiner* — Justin R Knapp
(74) *Attorney, Agent, or Firm* — Garlick & Markison; Timothy W. Markison; Shayne X. Short

(57) ABSTRACT

A computing device includes an interface configured to interface and communicate with a dispersed or distributed storage network (DSN), a memory that stores operational instructions, and a processing module operably coupled to the interface and memory such that the processing module, when operable within the computing device based on the operational instructions, is configured to perform various operations including to process monitor signals received from sensors coupled to biological memory devices (BMDs) within the DSN to determine status of the plurality of BMDs that distributedly store encoded data slices (EDSs) associated with a data object. The computing device services data access requests associated with the data object for the EDS(s). For some instances of BMD status, the computing device transfers EDS(s) from one portion of a BMD to another. For other instances of BMD status, the computing device rebuilds or directs rebuilding of EDS(s).

20 Claims, 8 Drawing Sheets

(51) Int. Cl.

| | | |
|---|---|---|
| *G06F 3/06* | (2006.01) | |
| *H04L 29/08* | (2006.01) | |
| *G06F 17/30* | (2006.01) | |
| *G06F 12/0813* | (2016.01) | |
| *G06F 12/0837* | (2016.01) | |
| *H03M 13/15* | (2006.01) | |
| *H04H 60/27* | (2008.01) | |
| *G06F 12/0871* | (2016.01) | |
| *G06F 12/122* | (2016.01) | |
| *G06F 12/128* | (2016.01) | |
| *G06F 9/50* | (2006.01) | |
| *G06F 12/12* | (2016.01) | |

(52) U.S. Cl.
CPC ...... *G06F 12/0837* (2013.01); *G06F 12/0871* (2013.01); *G06F 12/122* (2013.01); *G06F 12/128* (2013.01); *G06F 17/303* (2013.01); *G06F 17/30327* (2013.01); *G06F 17/30377* (2013.01); *G06N 3/002* (2013.01); *H03M 13/1515* (2013.01); *H04H 60/27* (2013.01); *H04L 67/1097* (2013.01); *H04L 67/26* (2013.01); *H04L 67/2842* (2013.01); *G06F 12/12* (2013.01); *G06F 2212/604* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working—Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

(56) References Cited

OTHER PUBLICATIONS

Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

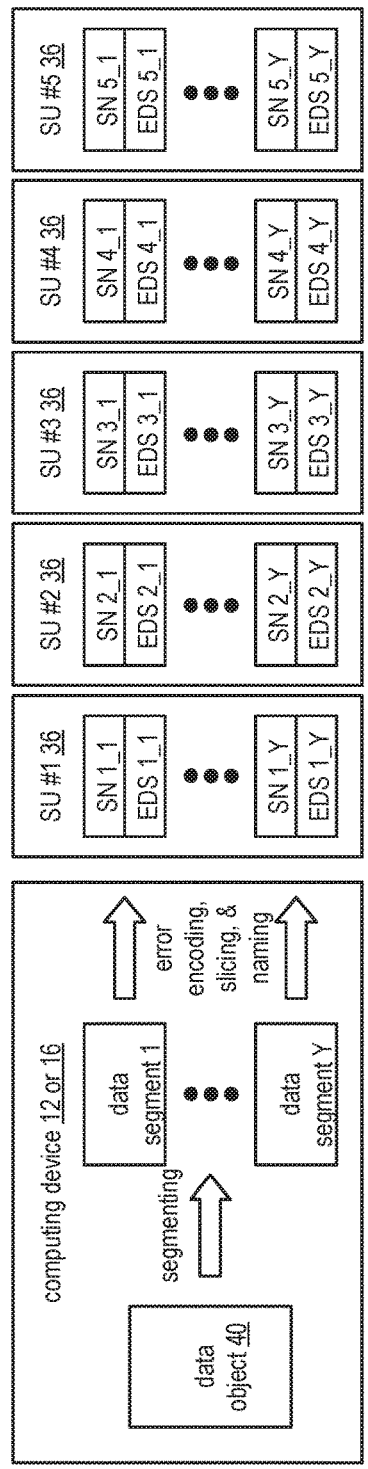
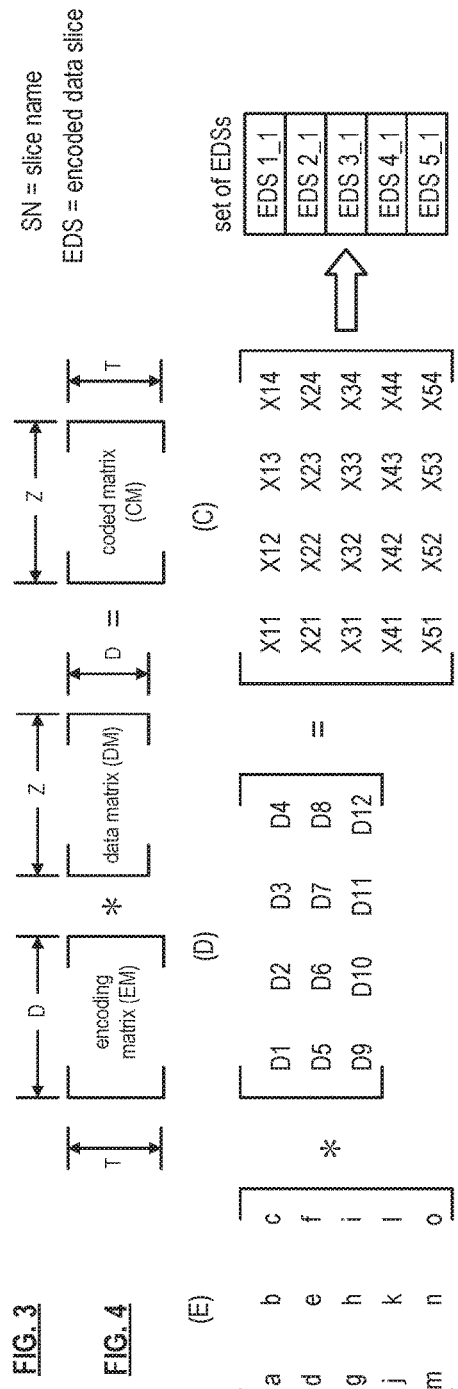
FIG. 3
FIG. 4
FIG. 5
FIG. 6

1000

DISPERSING DATA TO BIOLOGICAL MEMORY SYSTEMS

CROSS REFERENCE TO RELATED PATENTS

The present U.S. Utility Patent Application claims priority pursuant to 35 U.S.C. § 119(e) to U.S. Provisional Application No. 62/287,145, entitled "VERIFYING INTEGRITY OF ENCODED DATA SLICES," filed Jan. 26, 2016, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Prior art data storage systems are implemented using various forms of electronic-based memory storage devices. Given the finite nature and implementation of such prior art systems, the amount of information that can be stored within such data storage system is limited by the number and capacity of the prior art electronic-based memory storage devices. Moreover, when such an electronic-based memory storage device experiences failure, prior art maintenance and correction approaches typically replace the entirety of the electronic-based memory storage device with a fully-operational electronic-based memory storage device replacement.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
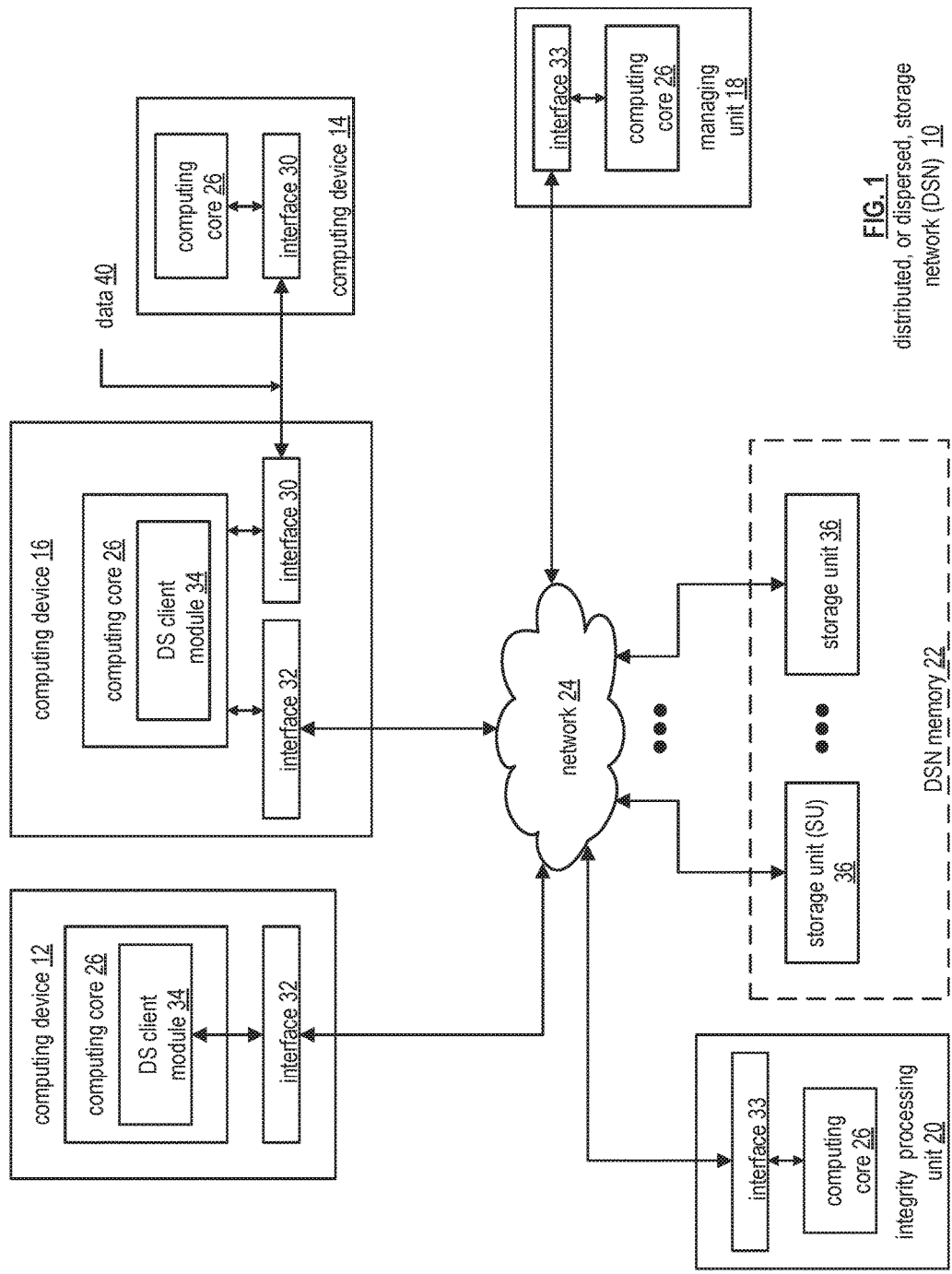
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
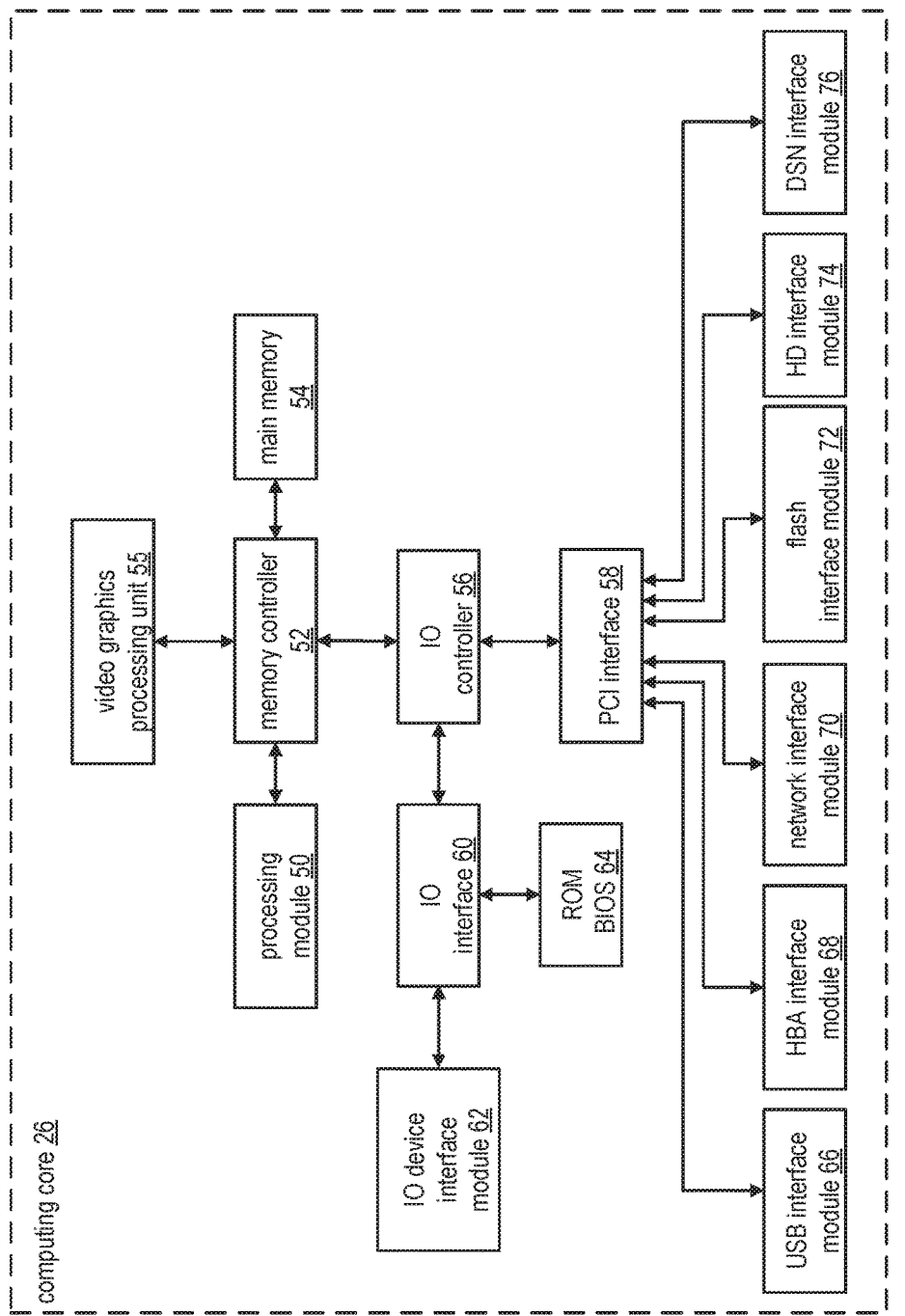
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
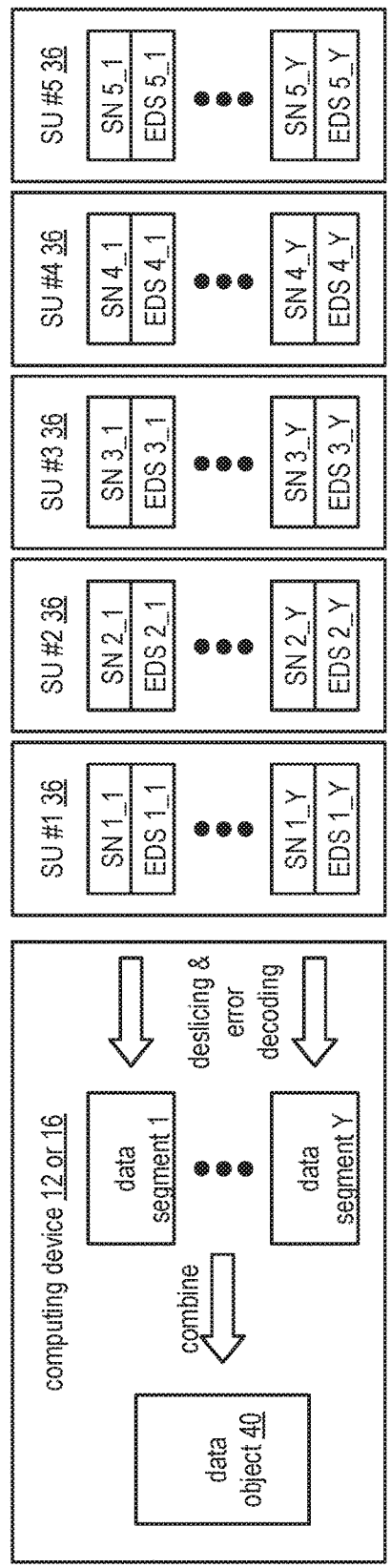
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
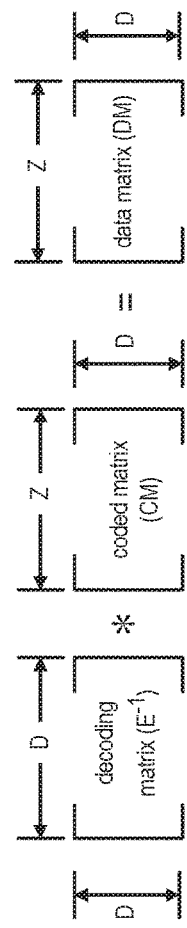
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
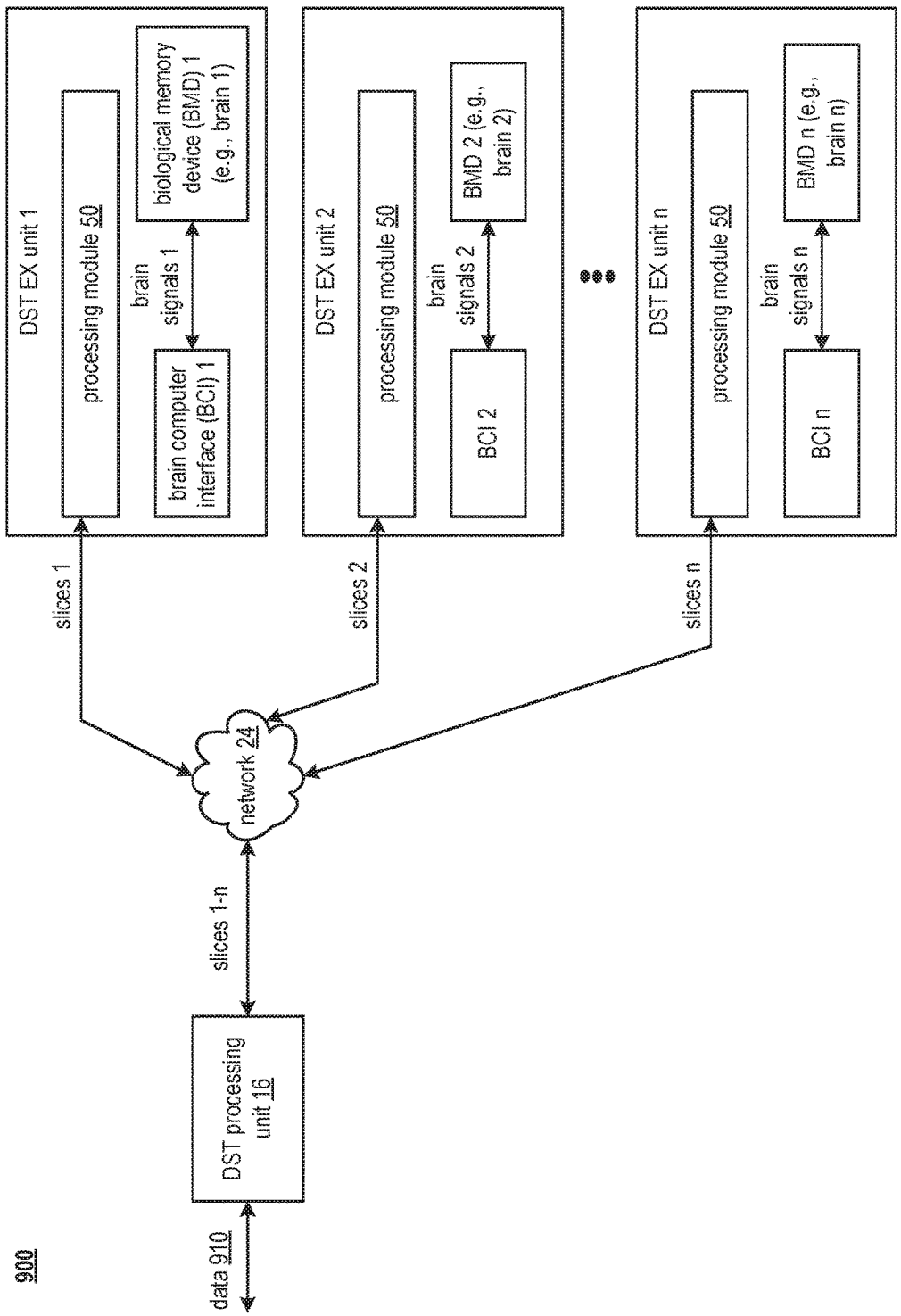
FIG. 9 is a schematic block diagram of another embodiment of a DSN in accordance with the present invention.

FIG. 9 is a schematic block diagram 900 of another embodiment of a DSN in accordance with the present invention. This includes a schematic block diagram of another embodiment of a dispersed storage network (DSN) that includes the distributed storage and task (DST) processing unit 16 (e.g., that may be a specific implementation of the computing device 12 or 16 of FIG. 1), the network 24 of FIG. 1, and a set of DST execution (EX) units 1 (e.g., that may be alternative specific implementations of the computing device 12 or 16 of FIG. 1). In some examples, each DST execution unit includes a processing module 50 such as described with respect to FIG. 2, a brain computer interface (e.g., sensors, signal detectors, signal emitters, etc.), and a brain (e.g., a software emulation module of a biological brain, a hybrid computer/biological brain, a biological brain). The DSN functions to encode data 910 for storage in a biological storage medium.

In an example of operation of the encoding of the data 910 for storage in the biological storage medium, when storing the data 910, the DST processing unit 16 dispersed storage error encodes the data 910 to produce one or more sets of encoded data slices 1-n and one or more sets of slice names associated with the one or more sets of encoded data slices. Having produced the slices and slice names, the DST processing unit 16 sends, via the network 24, the one or more sets of encoded data slices and the one or more sets of slice names to the set of DST execution units 1-n.

A brain computer interface of a DST execution unit receiving one or more corresponding encoded data slices of the one or more sets of encoded data slices, for each encoded data slice to be stored, issues, in accordance with a corresponding slice name, brain signals to a corresponding brain to facilitate storage of a brain pattern corresponding to the encoded data slice. The issuing includes encoding each encoded data slice utilizing a brain signal encoding algorithm in accordance with the slice name to produce the brain signal and transmitting the brain signal to the brain for storage (e.g., storage of the encoded data slice and an association with the slice name).

When retrieving the data 910 from the set of DST execution units, each brain computer interface issues brain access signals to the corresponding brain in accordance with a slice name of a set of slice names of a set of encoded data slices for retrieval. The issuing includes generating the brain access signal using a slice name and transmitting the brain access signal to the brain. Having issued the brain access signals to the corresponding brain, the brain computer interface decodes received brain signals corresponding to the slice name, where the brain signals represent a recovered encoded data slice. The decoding includes receiving the brain signals and decoding the brain signals utilizing a brain signal decoding algorithm to reproduce the associated encoded data slice. The processing module 84 sends, via the network 24, the recovered encoded data slices to the DST processing unit 16. The DST processing unit 16 dispersed storage error decodes a decode threshold number of received encoded data slices for each set of encoded data slices received from the DST execution units to reproduce the data 910.

Figure 10:
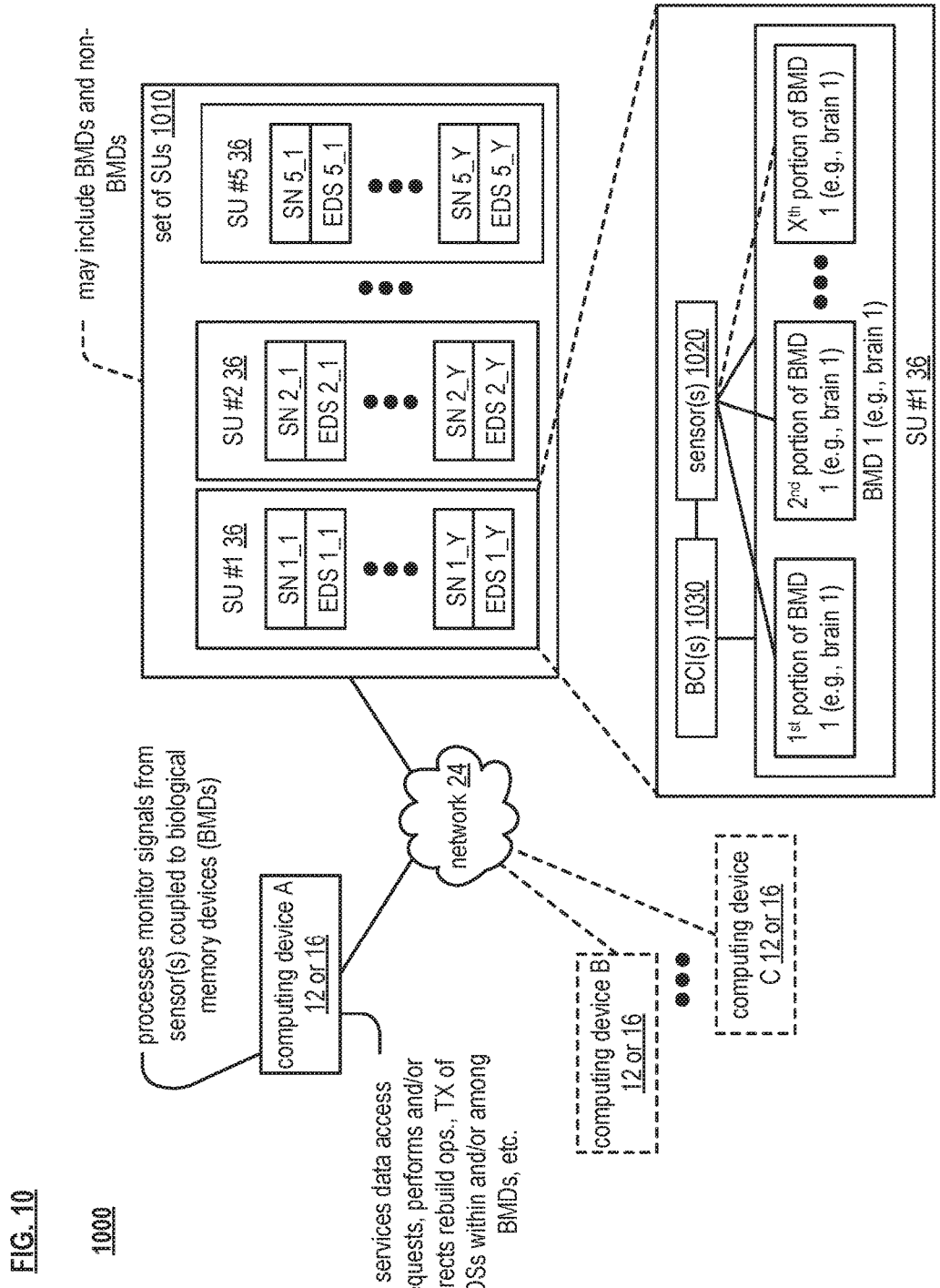
FIG. 10 is a schematic block diagram of another embodiment of a DSN in accordance with the present invention.

FIG. 10 is a schematic block diagram 1000 of another embodiment of a DSN in accordance with the present invention. A computing device 12 of 16 A is configured to interact with a set of storage units (SUs) 1010 via network 24 and/or any other devices in communication therewith. In some examples, more than one other computing devices 12 or 16 B, C is also configured to interact with the network 24 and/or any other devices in communication therewith.

The set of SUs 1010 includes one or more biological memory devices (BMDs) and may also include one or more non-BMDs. For example, a BMD includes a biological based device (e.g., brain, part of a brain, a nervous system based element, and/or any biological element that has memory storage related functions, etc.). Note that various examples of such BMDs may be human based, non-human based, and/or generally be based on any biological life form. As an example of a SU that includes a BMD, consider SU #1 36 that includes a BMD 1 (e.g., a brain 1) that includes different respective portions therein (e.g., $1^{st}$ portion of BMD 1, $2^{nd}$ portion of BMD 2, and so on to $X^{th}$ portion of BMD 1). In some examples, one or more sensors 1020 are coupled to each of the rep portions of the BMD. This may include a single sensor that couples to a single portion of the BMD 1, a single sensor that couples to multiple portions of the BMD 1, and/or multiple sensors that respectively couples to a different respective portions of the BMD 1. In general, any desired configuration of sensor(s) to BMD portion(s) may be implemented in various examples. In generally, the sensor(s) 1020 interfaces with the network 24 and/or any other computing devices via one or more brain computer interfaces (BCIs) 1030. In some examples, the one or more sensors 1020 couple and/or connect to the portion(s) of the BMD 1 and provide monitor signals via the BCI(s) 1030. In other examples, the one or more sensors 1020 couple and/or connect to the portion(s) of the BMD 1 via the BCI(s) 1030 and provide monitor signals via the BCI(s) 1030 to the computing device 12 of 16 A and/or other computing devices 12 or 16 B, . . . C.

In an example of operation and implementation, a computing device 12 or 16 A includes an interface configured to interface and communicate with a dispersed or distributed storage network (DSN), a memory that stores operational instructions, and a processing module operably coupled to the interface and memory such that the processing module, when operable within the computing device based on the operational instructions, is configured to perform various operations.

For example, on an example, the computing device 12 or 16 A is configured to process monitor signals received from sensor(s) 1020 coupled to biological memory device(s) (BMD(s)) such as BMD 1 (and/or BMD 2, BMD 3, etc. and so on as may be also implemented within SU #1 36 and/or within other SUs of the set of SUs 1010) within the DSN via brain computer interface(s) (BCI(s)) 1030 that respectively couple to the BMD(s) to determine status of the BMD(s) that distributedly store a set of encoded data slices (EDSs) associated with a data object. Note that the data object is segmented into a data segments, and a data segment of the plurality of data segments is dispersed error encoded in accordance with dispersed error encoding parameters to produce a set of EDSs.

The computing device 12 or 16 A is also configured to service data access requests associated with the data object for at least some of the EDSs of the set of EDSs via the BCI(s) 1030 that couple (e.g., individually, respectively, etc.) to the BMD(s). Examples of data access requests may include read, write, rebuild, status check, etc. and/or any other data access requests as may be performed within a DSN.

In an example, when status of a first portion of a first biological memory device (BMD) (e.g., BMD 1) of the BMD(s) compares unfavorably to a first threshold and compares favorably to a second threshold that is lower than the first threshold, the computing device 12 or 16 A is also configured to transfer one or more EDSs of the set of EDSs stored in the first portion of the first BMD (e.g., BMD 1) to a second portion of the first BMD (e.g., BMD 1) that has status that compares favorably with the first threshold. When monitors provide information to various portions of the first BMD (e.g., BMD 1), the computing device 12 or 16 A is also configured to determine the relative health, status, etc. of the various portions therein. For example, a portion of the first BMD (e.g., BMD 1) may indicate that it I failing, but not yet fully failed. In a preemptive action, the computing device 12 or 16 A is also configured to transfer one or more EDSs of the set of EDSs stored in the first portion of the first BMD (e.g., BMD 1) to a second portion of the first BMD (e.g., BMD 1) that has status that compares favorably with the first threshold (e.g., to another portion of the first BMD (e.g., BMD 1)) that is not failing at all. Such preemptive action can preserve the one or more EDSs of the set of EDSs without needing to perform a rebuild operation. Alternatively, status that compares unfavorably with to the second threshold that is lower than the first threshold that may indicate a complete failure of the BMD and/or portion thereof. Note that multiple thresholds may be used to indicate different respective levels of good or poor health, changing health, degradation, etc. to provide for additional information to make decisions regarding actions related to storage of EDSs within the DSN.

In another example, when status of the first portion of the first BMD (e.g., BMD 1) of the plurality of BMDs compares unfavorably to the second threshold, the computing device 12 or 16 A is also configured to perform a rebuild of the one or more EDSs of the set of EDSs stored in the first portion of the first BMD (e.g., BMD 1) to generate rebuilt one or more EDSs of the set of EDSs and store the rebuilt one or more EDSs of the set of EDSs in the second portion of the first BMD (e.g., BMD 1) that has status that compares favorably with the first threshold or within a second BMD (e.g., BMD 2) that has status that compares favorably with the first threshold. In some examples, this may be based on a situation when it is determined that the first portion of the first BMD (e.g., BMD 1) has failed. In such instances, the one or more EDSs of the set of EDSs undergoes a rebuild operation.

In even other examples, when the status of the first portion of the first BMD (e.g., BMD 1) of the plurality of BMDs compares favorably with the first threshold after the status of the first portion of the first BMD (e.g., BMD 1) of the plurality of BMDs has previously compare unfavorably with the first threshold and after the one or more EDSs of the set of EDSs previously stored in the first portion of the first BMD (e.g., BMD 1) have been transferred to the second portion of the first BMD (e.g., BMD 1), the computing device 12 or 16 A is also configured to transfer the one or more EDSs of the set of EDSs from the second portion of the first BMD (e.g., BMD 1) back to the first portion of the first BMD (e.g., BMD 1). For example, when a portion of the BMD has perhaps recovered, regenerated, been cured of and/or treated for a disease and can operate properly again, etc., the computing device 12 or 16 A is also configured to transfer the one or more EDSs of the set of EDSs back to that portion of the BMD that had previously been deemed ineffective to perform memory storage operations and has since been deemed effective to perform memory storage operations.

In other examples, when status of the first portion of the first BMD (e.g., BMD 1) of the plurality of BMDs compares unfavorably with the second threshold that is lower than the first threshold, the computing device 12 or 16 A is also configured to direct another computing device to perform the rebuild of the one or more EDSs of the set of EDSs stored in the first portion of the first BMD (e.g., BMD 1) to generate the rebuilt one or more EDSs of the set of EDSs.

In some examples, when status of the first portion of the first BMD (e.g., BMD 1) of the plurality of BMDs compares unfavorably with the first threshold, the computing device 12 or 16 A is also configured to transfer the one or more EDSs or one or more other EDSs of the set of EDSs stored in the first portion of the first BMD (e.g., BMD 1) to a storage unit (SU) that is a non-BMD within the DSN. For example, a given SU or set of SUs may include one or more BMDs and/or one or more non-BMDs (e.g., electronic-based memory storage devices).

Also, with respect to the EDSs associated with the data segment, note that a decode threshold number of EDSs are needed to recover the data segment, and a read threshold number of EDSs provides for reconstruction of the data segment. Also, note that a write threshold number of EDSs provides for a successful transfer of the set of EDSs from a first at least one location in the DSN to a second at least one location in the DSN.

Note that the computing device may be located at a first premises that is remotely located from at least one BMD of the plurality of BMDs within the DSN. Also, note that the computing device may be of any of a variety of types of devices as described herein and/or their equivalents including a storage unit (SU) of any group and/or set of SUs within the DSN, a wireless smart phone, a laptop, a tablet, a personal computers (PC), a work station, and/or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

In addition, when considering a DSN, note that some devices (e.g., non-BMDs) can include a significant amount of functionality and capability to perform other operations besides storage of information. For example, a given non-BMD may itself perform many other functions besides memory storage including scanning, rebuilding of data (e.g., EDSs) data, etc. In general, a BMD (e.g., an organic kind of memory is not operative to perform such operations). As such, another device (e.g., an execution unit, a computing device, an accessor device and/or accessor related functionality such as may be performed by a computing device, etc.) operates to perform such operations with respect to EDSs stored in a BMD including scanning, rebuilding of data (e.g., EDSs) data, etc. As such, a DSN that includes one or more BMDs can implemented one or more computing devices to perform such operations that cannot be performed by the one or more BMDs and/or devices that include one or more BMDs. For example, another other unit (e.g., an accessor, another computing device, etc.) can operate to access a BMD and monitor to see if something has gone badly or is trending toward that direction (e.g., trending towards failure, etc.). A separate device (e.g., accessor, another computing device, etc.) takes care of other operations such as rebuilding. In addition, a memory unit, SU, execution unit, ect may be implemented to perform operations such as rebuilding. The processing, functionality, capability, CPU, etc. on such one or more other devices (e.g., an accessor, another computing device, an external appliance, etc.) operates to perform such functions.

In addition, with respect to electronic-based memory storage device, when any piece of such a electronic-based memory storage devices fails (e.g., any part of a hard disk drive (HDD) is going bad), then the entire electronic-based memory storage devices is typically replaced. For example, this may also involve moving data from one HDD (e.g., a failing HDD that has not yet fully failed) to one or more other HDDs.

In contradistinction, if one part of the BMD is failing bad (e.g., some small piece or portion of the BMD), then the DSN can operate to move data from that failing part or portion of the BMD to another part of BMD that is operating properly. In addition, when the part of the BMD that has gone bad (e.g., some small piece) recovers, then it may be re-used.

Moreover, when a memory unit that stores data and is capable to perform other functions is beginning to fail, then that memory unit may also have ability to perform various operations such as device evacuation (e.g., move some or all of its stored information to another unit), etc. With respect to a BMD that does not include a CPU, processing circuitry, etc., then at least one other external appliance is implemented to perform such functions (e.g., an accessor, another computing device, etc.).

Figure 11:
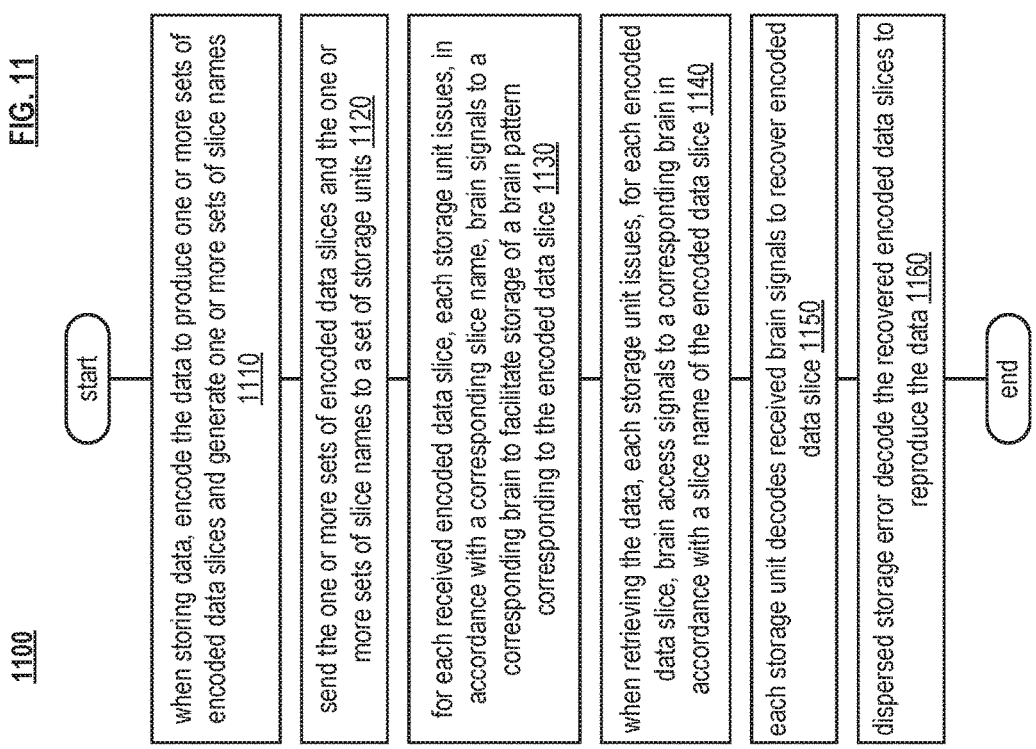
FIG. 11 is a diagram illustrating an embodiment of a method for execution by one or more computing devices in accordance with the present invention.

FIG. 11 is a diagram illustrating an embodiment of a method 1100 for execution by one or more computing devices in accordance with the present invention. This includes a flowchart illustrating an example of encoding data for storage in a biological storage medium. The method 1100 includes a step 1110 where a processing module (e.g., of a distributed storage and task (DST) processing unit), when storing data, encodes the data to produce one or more sets of encoded data slices and generates one or more sets of slice names for the one or more sets of encoded slices. The encoding includes dispersed storage error encoding the data to produce the one or more sets of encoded slices and generating the one or more sets of slice names corresponding to the one or more sets of encoded data slices.

The method 1100 continues at the step 1120 where the processing module sends the one or more sets of encoded data slices and the one or more sets of slice names to a set of storage units. For example, the processing module generates one or more sets of write slice requests that includes the one or more sets of encoded data slices and the one or more sets of slice names, and sends the one or more sets of write slice requests to the set of storage units.

For each received encoded data slice, the method 1100 continues at the step 1130 where each storage unit issues, in accordance with a corresponding slice name, brain signals to a corresponding brain to facilitate storage of a brain pattern corresponding to the encoded data slice. The issuing includes encoding the encoded data slice utilizing a brain signal encoding algorithm in accordance with the slice name to produce the brain signal and transmitting the brain signal to the brain.

When retrieving the data, the method 1100 continues at the step 1140 where each storage unit issues, for each encoded data slice, brain access signals to a corresponding brain in accordance with a slice name of the encoded data slice. The issuing includes generating the brain access signal using the slice name and transmitting the brain access signal to the brain. The method 1100 continues at the step 1150 where each storage unit decodes received brain signals to recover encoded data slices. For example, the storage unit receives the brain signals and decodes the brain signals utilizing a brain signal decoding algorithm to reproduce the encoded data slices for corresponding slice names. Having reproduced encoded data slices, the storage unit sends the encoded data slices to the processing module.

The method 1100 continues at the step 1160 where the processing module dispersed storage error decodes the recovered encoded data slices to reproduce the data. For example, for each set of encoded data slices, the processing module disperse storage error decodes a decode threshold number of encoded data slices to reproduce a data segment of a plurality of data segments and aggregates the plurality of data segments to produce the reproduced data.

Figure 12:
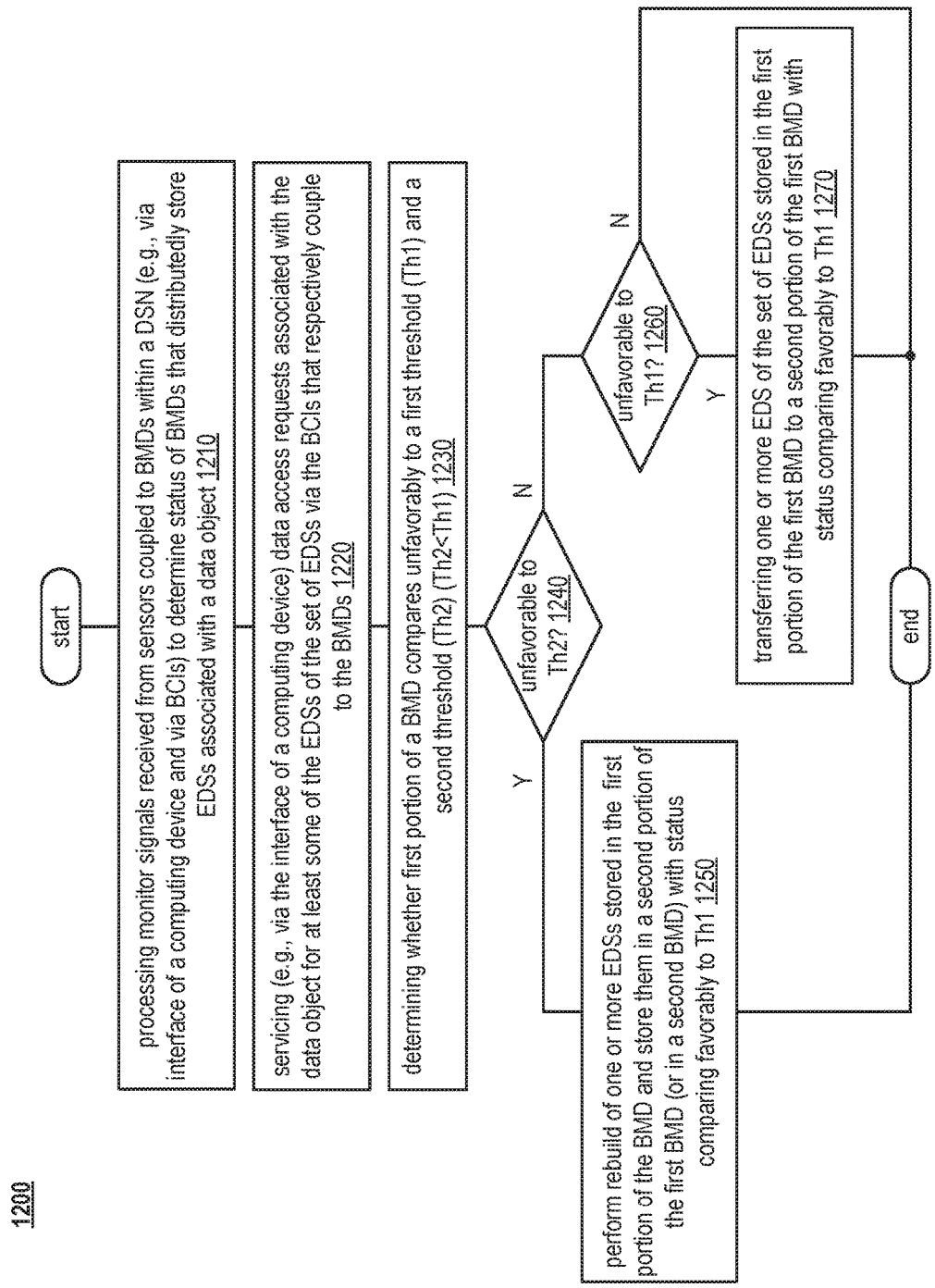
FIG. 12 is a diagram illustrating another embodiment of a method for execution by one or more computing devices in accordance with the present invention.

FIG. 12 is a diagram illustrating another embodiment of a method 1200 for execution by one or more computing devices in accordance with the present invention. This includes a flowchart illustrating an example of encoding data for storage in a biological storage medium in accordance with the present invention.

The method 1201 begins in step 1210 by processing monitor signals received via from a plurality of sensors coupled to a plurality of biological memory devices (BMDs) within a dispersed or distributed storage network (DSN) via an interface of the computing device configured to interface and communicate with the DSN and via a plurality of brain computer interfaces (BCIs) that respectively couple to the plurality of BMDs to determine status of the plurality of BMDs that distributedly store a set of encoded data slices (EDSs) associated with a data object. Note that the data object is segmented into a plurality of data segments, and wherein a data segment of the plurality of data segments is dispersed error encoded in accordance with dispersed error encoding parameters to produce a set of EDSs.

The method 1201 continues in step 1220 by servicing, via the interface of the computing device, data access requests associated with the data object for at least some of the EDSs of the set of EDSs via the plurality of BCIs that respectively couple to the plurality of BMDs.

The method 1201 continues in step 1230 by determining whether status of a first portion of a first biological memory device (BMD) of the plurality of BMDs compares unfavorably to a first threshold and compares favorably to a second threshold that is lower than the first threshold. When status of a first portion of a first biological memory device (BMD) of the plurality of BMDs compares unfavorably to a first threshold and compares favorably to a second threshold that is lower than the first threshold (step 1240 and step 1260), the method 1201 continues in step 1270 by transferring one or more EDSs of the set of EDSs stored in the first portion of the first BMD to a second portion of the first BMD that has status that compares favorably with the first threshold.

When status of the first portion of the first BMD of the plurality of BMDs compares unfavorably with a second threshold that is lower than the first threshold (step 1240), method 1201 continues in step 1250 by performing a rebuild of the one or more EDSs of the set of EDSs stored in the first portion of the first BMD to generate rebuilt one or more EDSs of the set of EDSs and store the rebuilt one or more EDSs of the set of EDSs in the second portion of the first BMD that has status that compares favorably with the first threshold or within a second BMD that has status that compares favorably with the first threshold.

This disclosure presents, among other things, various examples of BMDs that may be used for storage of data and information. For example, nature uses multiple techniques for storing information, including deoxyribonucleic acid (DNA), ribonucleic acid (RNA), neural networks, and/or other such schemes. Many of these mechanisms offer greater density, efficiency, reliability, and mean time between failure (MTTF), while using less energy, and suffering fewer faults than man-made storage technologies. Modern brain computer interfaces (BCIs) have succeeded in interfacing with memory-regions of mammalian brains (e.g., the hippocampus). A DSN memory may be created that uses a collection of BMDs (e.g., brains) along with BCIs to store and retrieve error coded information. An individual BMD (e.g., or brain) or DNA molecule is subject to failure: a DNA molecule may mutate, a biological brain's host may die or develop disease, and/or such BMDs may recover and later be useful. Therefore, error coding techniques (e.g., error checking and correction (ECC) coding, forward error correction (FEC) coding, are used by the DSN memory to distribute unique slices (e.g., EDSs) of information across multiple brains, such that recovery remains possible in the event that any threshold number of brains can faithfully retrieve the stored data. ds units may operate against the BCIs directly by wires or with a wireless interface to encode slice data (e.g., EDS) into the patterns, structures, and connections of neurons within a brain.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
   an interface configured to interface and communicate with a dispersed or distributed storage network (DSN);
   memory that stores operational instructions; and
   a processing module operably coupled to the interface and to the memory, wherein the processing module, when operable within the computing device based on the operational instructions, is configured to:
      process monitor signals received from a plurality of sensors coupled to a plurality of biological memory devices (BMDs) within the DSN via a plurality of brain computer interfaces (BCIs) that respectively couple to the plurality of BMDs to determine status of the plurality of BMDs that distributedly store a set of encoded data slices (EDSs) associated with a data object, wherein the status of the plurality of BMDs corresponds to at least one of levels of good health, levels of poor health, levels of changing health, levels of degradation of health, levels of recovery of good health, or levels of regeneration for the plurality of BMDs, wherein the data object is segmented into a plurality of data segments, and wherein a data segment of the plurality of data segments is dispersed error encoded in accordance with dispersed error encoding parameters to produce a set of EDSs;
      service, via the interface and via the DSN, data access requests associated with the data object from at least one other computing device within the DSN for at least some of the EDSs of the set of EDSs via the plurality of BCIs that respectively couple to the plurality of BMDs;
      when status of a first portion of a first biological memory device (BMD) of the plurality of BMDs compares unfavorably to a first threshold and compares favorably to a second threshold that is lower than the first threshold, transfer one or more EDSs of the set of EDSs stored in the first portion of the first BMD to a second portion of the first BMD that has status that compares favorably with the first threshold, wherein the first threshold corresponds to at least one of a first level of good health, a first level of poor health, a first level of changing health, a first level of degradation of health, a first level of recovery of good health, or a first level of regeneration, and the second threshold corresponds to at least one of a second level of good health, a second level of poor health, a second level of changing health, a second level of degradation of health, a second level of recovery of good health, or a second level of regeneration; and
      when status of the first portion of the first BMD of the plurality of BMDs compares unfavorably to the second threshold, perform a rebuild of the one or more EDSs of the set of EDSs stored in the first portion of the first BMD in accordance with the dispersed error encoding parameters to generate rebuilt one or more EDSs of the set of EDSs and store, via the interface and via the DSN, the rebuilt one or more EDSs of the set of EDSs in the second portion of the first BMD that has status that compares favorably with the first threshold or within a second BMD that has status that compares favorably with the first threshold.

2. The computing device of claim 1, wherein the processing module, when operable within the computing device based on the operational instructions, is further configured to:
   when the status of the first portion of the first BMD of the plurality of BMDs compares favorably with the first threshold after the status of the first portion of the first BMD of the plurality of BMDs has previously compare unfavorably with the first threshold and after the one or more EDSs of the set of EDSs previously stored in the first portion of the first BMD have been transferred to the second portion of the first BMD, transfer the one or more EDSs of the set of EDSs from the second portion of the first BMD back to the first portion of the first BMD.

3. The computing device of claim 1, wherein the processing module, when operable within the computing device based on the operational instructions, is further configured to:
when status of the first portion of the first BMD of the plurality of BMDs compares unfavorably with the second threshold that is lower than the first threshold, direct another computing device to perform the rebuild of the one or more EDSs of the set of EDSs stored in the first portion of the first BMD to generate the rebuilt one or more EDSs of the set of EDSs.

4. The computing device of claim 1, wherein the processing module, when operable within the computing device based on the operational instructions, is further configured to:
when status of the first portion of the first BMD of the plurality of BMDs compares unfavorably with the first threshold, transfer the one or more EDSs or one or more other EDSs of the set of EDSs stored in the first portion of the first BMD to a storage unit (SU) that is a non-BMD within the DSN.

5. The computing device of claim 1, wherein:
a decode threshold number of EDSs are needed to recover the data segment;
a read threshold number of EDSs provides for reconstruction of the data segment; and
a write threshold number of EDSs provides for a successful transfer of the set of EDSs from a first at least one location in the DSN to a second at least one location in the DSN.

6. The computing device of claim 1, wherein the computing device is located at a first premises that is remotely located from at least one BMD of the plurality of BMDs within the DSN.

7. The computing device of claim 1 further comprising:
a storage unit (SU) of a plurality of storage units (SUs) within the DSN, a wireless smart phone, a laptop, a tablet, a personal computers (PC), a work station, or a video game device.

8. The computing device of claim 1, wherein the DSN includes at least one of a wireless communication system, a wire lined communication system, a non-public intranet system, a public internet system, a local area network (LAN), or a wide area network (WAN).

9. A computing device comprising:
an interface configured to interface and communicate with a dispersed or distributed storage network (DSN);
memory that stores operational instructions; and
a processing module operably coupled to the interface and to the memory, wherein the processing module, when operable within the computing device based on the operational instructions, is configured to:
process monitor signals received from a plurality of sensors coupled to a plurality of biological memory devices (BMDs) within the DSN via a plurality of brain computer interfaces (BCIs) that respectively couple to the plurality of BMDs to determine status of the plurality of BMDs that distributedly store a set of encoded data slices (EDSs) associated with a data object, wherein the status of the plurality of BMDs corresponds to at least one of levels of good health, levels of poor health, levels of changing health, levels of degradation of health, levels of recovery of good health, or levels of regeneration for the plurality of BMDs, wherein the data object is segmented into a plurality of data segments, wherein a data segment of the plurality of data segments is dispersed error encoded in accordance with dispersed error encoding parameters to produce a set of EDSs, wherein a decode threshold number of EDSs are needed to recover the data segment, wherein a read threshold number of EDSs provides for reconstruction of the data segment, and wherein a write threshold number of EDSs provides for a successful transfer of the set of EDSs from a first at least one location in the DSN to a second at least one location in the DSN;
service, via the interface and via the DSN, data access requests associated with the data object from at least one other computing device within the DSN for at least some of the EDSs of the set of EDSs via the plurality of BCIs that respectively couple to the plurality of BMDs;
when status of a first portion of a first biological memory device (BMD) of the plurality of BMDs compares unfavorably to a first threshold and compares favorably to a second threshold that is lower than the first threshold, transfer one or more EDSs of the set of EDSs stored in the first portion of the first BMD to a second portion of the first BMD that has status that compares favorably with the threshold, wherein the first threshold corresponds to at least one of a first level of good health, a first level of poor health, a first level of changing health, a first level of degradation of health, a first level of recovery of good health, or a first level of regeneration, and the second threshold corresponds to at least one of a second level of good health, a second level of poor health, a second level of changing health, a second level of degradation of health, a second level of recovery of good health, or a second level of regeneration;
when status of the first portion of the first BMD of the plurality of BMDs compares unfavorably with the second threshold, perform a rebuild of the one or more EDSs of the set of EDSs stored in the first portion of the first BMD in accordance with the dispersed error encoding parameters to generate rebuilt one or more EDSs of the set of EDSs and store, via the interface and via the DSN, the rebuilt one or more EDSs of the set of EDSs in the second portion of the first BMD that has status that compares favorably with the first threshold or within a second BMD that has status that compares favorably with the first threshold; and
when the status of the first portion of the first BMD of the plurality of BMDs compares favorably with the first threshold after the status of the first portion of the first BMD of the plurality of BMDs has previously compared unfavorably with the first threshold and after the one or more EDSs of the set of EDSs previously stored in the first portion of the first BMD have been transferred to the second portion of the first BMD, transfer the one or more EDSs of the set of EDSs from the second portion of the first BMD back to the first portion of the first BMD.

10. The computing device of claim 9, wherein the processing module, when operable within the computing device based on the operational instructions, is further configured to:
when status of the first portion of the first BMD of the plurality of BMDs compares unfavorably with the second threshold that is lower than the first threshold, direct another computing device to perform the rebuild of the one or more EDSs of the set of EDSs stored in the first portion of the first BMD to generate the rebuilt one or more EDSs of the set of EDSs.

11. The computing device of claim 9, wherein the processing module, when operable within the computing device based on the operational instructions, is further configured to:
when status of the first portion of the first BMD of the plurality of BMDs compares unfavorably with the first threshold, transfer the one or more EDSs or one or more other EDSs of the set of EDSs stored in the first portion of the first BMD to a SU that is a non- BMD within the DSN.

12. The computing device of claim 9 further comprising:
a storage unit (SU) of a plurality of storage units (SUs) within the DSN, a wireless smart phone, a laptop, a tablet, a personal computers (PC), a work station, or a video game device.

13. The computing device of claim 9, wherein the DSN includes at least one of a wireless communication system, a wire lined communication system, a non-public intranet system, a public internet system, a local area network (LAN), or a wide area network (WAN).

14. A method for execution by a computing device, the method comprising:
processing monitor signals received via from a plurality of sensors coupled to a plurality of biological memory devices (BMDs) within a dispersed or distributed storage network (DSN) via an interface of the computing device configured to interface and communicate with the DSN and via a plurality of brain computer interfaces (BCIs) that respectively couple to the plurality of BMDs to determine status of the plurality of BMDs that distributedly store a set of encoded data slices (EDSs) associated with a data object, wherein the status of the plurality of BMDs corresponds to at least one of levels of good health, levels of poor health, levels of changing health, levels of degradation of health, levels of recovery of good health, or levels of regeneration for the plurality of BMDs, wherein the data object is segmented into a plurality of data segments, and wherein a data segment of the plurality of data segments is dispersed error encoded in accordance with dispersed error encoding parameters to produce a set of EDSs;
servicing, via the interface of the computing, device and via the DSN, data access requests associated with the data object from at least one other computing device within the DSN for at least some of the EDSs of the set of EDSs via the plurality of BCIs that respectively couple to the plurality of BMDs;
when status of a first portion of a first biological memory device (BMD) of the plurality of BMDs compares unfavorably to a first threshold and compares favorably to a second threshold that is lower than the first threshold, transferring one or more EDSs of the set of EDSs stored in the first portion of the first BMD to a second portion of the first BMD that has status that compares favorably with the first threshold, wherein the first threshold corresponds to at least one of a first level of good health, a first level of poor health, a first level of changing health, a first level of degradation of health, a first level of recovery of good health, or a first level of regeneration, and the second threshold corresponds to at least one of a second level of good health, a second level of poor health, a second level of changing health, a second level of degradation of health, a second level of recovery of good health, or a second level of regeneration; and
when status of the first portion of the first BMD of the plurality of BMDs compares unfavorably with a second threshold that is lower than the first threshold, performing a rebuild of the one or more EDSs of the set of EDSs stored in the first portion of the first BMD in accordance with the dispersed error encoding parameters to generate rebuilt one or more EDSs of the set of EDSs and storing, via the interface and via the DSN, the rebuilt one or more EDSs of the set of EDSs in the second portion of the first BMD that has status that compares favorably with the first threshold or within a second BMD that has status that compares favorably with the first threshold.

15. The method of claim 14 further comprising:
when the status of the first portion of the first BMD of the plurality of BMDs compares favorably with the first threshold after the status of the first portion of the first BMD of the plurality of BMDs has previously compared unfavorably with the first threshold and after the one or more EDSs of the set of EDSs previously stored in the first portion of the first BMD have been transferred to the second portion of the first BMD, transferring the one or more EDSs of the set of EDSs from the second portion of the first BMD back to the first portion of the first BMD.

16. The method of claim 14 further comprising:
when status of the first portion of the first BMD of the plurality of BMDs compares unfavorably with the second threshold that is lower than the first threshold, directing another computing device to perform the rebuild of the one or more EDSs of the set of EDSs stored in the first portion of the first BMD to generate the rebuilt one or more EDSs of the set of EDSs.

17. The method of claim 14 further comprising:
when status of the first portion of the first BMD of the plurality of BMDs compares unfavorably with the first threshold, transferring the one or more EDSs or one or more other EDSs of the set of EDSs stored in the first portion of the first BMD to a storage unit (SU) that is a non-BMD within the DSN.

18. The method of claim 14, wherein:
a decode threshold number of EDSs are needed to recover the data segment;
a read threshold number of EDSs provides for reconstruction of the data segment; and
a write threshold number of EDSs provides for a successful transfer of the set of EDSs from a first at least one location in the DSN to a second at least one location in the DSN.

19. The method of claim 14, wherein the computing device is a storage unit (SU) of a plurality of storage units (SUs) within the DSN, a wireless smart phone, a laptop, a tablet, a personal computers (PC), a work station, or a video game device.

20. The method of claim 14, wherein the DSN includes at least one of a wireless communication system, a wire lined communication system, a non-public intranet system, a public internet system, a local area network (LAN), or a wide area network (WAN).

* * * * *